US012672260B2

(12) United States Patent
Krammer et al.

(10) Patent No.: US 12,672,260 B2
(45) Date of Patent: Jun. 30, 2026

(54) HEAT DISSIPATION DEVICE

(71) Applicant: 4MOTEC GMBH & CO KG, Graz (AT)

(72) Inventors: Gert Krammer, Graz (AT); Gerald Pöllmann, Graz (AT)

(73) Assignee: 4MOTEC GMBH & CO KG, Graz (AT)

( * ) Notice: Subject to any disclaimer, the term of this patent is extended or adjusted under 35 U.S.C. 154(b) by 490 days.

(21) Appl. No.: 17/759,303

(22) PCT Filed: Dec. 16, 2020

(86) PCT No.: PCT/AT2020/060465
§ 371 (c)(1),
(2) Date: Jul. 22, 2022

(87) PCT Pub. No.: WO2021/151130
PCT Pub. Date: Aug. 5, 2021

(65) Prior Publication Data
US 2023/0051026 A1     Feb. 16, 2023

(30) Foreign Application Priority Data

Jan. 27, 2020    (AT) .............................. A 50059/2020

(51) Int. Cl.
*H05K 7/20*          (2006.01)
(52) U.S. Cl.
CPC ................................. *H05K 7/2039* (2013.01)
(58) Field of Classification Search
CPC .... H05K 7/2039; H05K 7/20409; H05K 7/20; H05K 7/20145; H01W 40/226;
(Continued)

(56) References Cited

U.S. PATENT DOCUMENTS

| | | | | | |
|---|---|---|---|---|---|
| 3,299,949 | A | * | 1/1967 | Beurtheret | .............. H01J 19/74 |
| | | | | | 165/185 |
| 4,638,858 | A | * | 1/1987 | Chu | ........................ F28F 13/12 |
| | | | | | 165/181 |

(Continued)

FOREIGN PATENT DOCUMENTS

| | | |
|---|---|---|
| DE | 10153512 A1 | 5/2003 |
| EP | 2369620 A2 | 9/2011 |

OTHER PUBLICATIONS

International Search Report, European International Search Authority, mailed Mar. 31, 2021, from PCT/AT2020/060465 filed Dec. 16, 2020.

*Primary Examiner* — Harry E Arant
(74) *Attorney, Agent, or Firm* — Workman Nydegger

(57)          ABSTRACT

A heat discharge device having a bottom plate having a bottom and an upper surface. Heat discharge blades extend between two front faces of the bottom plate and inclinations of the heat discharge blades are configured in a way such that neighbouring heat discharge blades alternatingly approach one another and move away from each other. Neighbouring heat discharge blades are connected to one another at the end regions facing away from the upper surface of the bottom plate directly and delimit a first air flow channel. Neighbouring heat discharge blades delimit a second air flow channel, which is open at the side facing away from the upper surface of the bottom plate. The heat discharge blades have a group of air vents, wherein the first air flow channels are open at the opposite distal ends thereof and the second air flow channels are closed at the opposite distal ends thereof.

19 Claims, 4 Drawing Sheets

(58) Field of Classification Search
CPC ... H01W 4/043; H01W 40/60; H01W 40/231;
F28F 3/027; F28F 2215/08
See application file for complete search history.

(56) References Cited

U.S. PATENT DOCUMENTS

| 5,435,384 | A | * | 7/1995 | Wu | F28F 3/04 |
| | | | | | 165/185 |
| 5,609,201 | A | * | 3/1997 | Anderson | F28F 3/12 |
| | | | | | 257/722 |
| 5,653,285 | A | * | 8/1997 | Lee | H01L 23/3672 |
| | | | | | 174/16.3 |
| 5,701,951 | A | * | 12/1997 | Jean | H01L 23/467 |
| | | | | | 174/16.3 |
| 5,704,419 | A | * | 1/1998 | Agonafer | H01L 23/467 |
| | | | | | 257/E23.099 |
| 6,161,610 | A | | 12/2000 | Azar | |
| 6,328,529 | B1 | * | 12/2001 | Yamaguchi | H01L 23/467 |
| | | | | | 415/214.1 |
| 6,590,770 | B1 | * | 7/2003 | Rogers | H01L 23/3672 |
| | | | | | 257/722 |
| 6,650,538 | B1 | * | 11/2003 | Chu | H01L 23/467 |
| | | | | | 257/722 |
| 7,182,124 | B2 | * | 2/2007 | Chen | H01L 23/467 |
| | | | | | 165/185 |
| 7,191,822 | B2 | * | 3/2007 | Huang | H01L 21/4878 |
| | | | | | 165/185 |
| 7,532,478 | B2 | * | 5/2009 | Jeong | H05K 5/02 |
| | | | | | 313/46 |
| D613,258 | S | * | 4/2010 | Walker | D13/179 |
| 9,801,306 | B2 | * | 10/2017 | Siracki | H05K 7/2039 |
| 2005/0252642 | A1 | | 11/2005 | Chang | |
| 2006/0042782 | A1 | | 3/2006 | Chen | |
| 2010/0108292 | A1 | | 5/2010 | Bhunia et al. | |

* cited by examiner

HEAT DISSIPATION DEVICE

The present application is a U.S. National Stage of International Application No. PCT/AT2020/060465, filed on Dec. 16, 2020, designating the United States and claiming the priority of Austria Patent Application No. A 50059/2020 filed with the Austria Patent Office on Jan. 27, 2020. All of the aforementioned applications are incorporated herein in their respective entireties by this reference.

The present invention relates to a heat discharge device for arrangement on at least one electronic component, comprising a heat conductive bottom plate having a bottom and an upper surface facing away from the bottom, wherein heat discharge blades extend between two opposite front aces of the bottom plate from the upper surface of the bottom plate transversely across the bottom plate and inclined in respect to the upper surface of the bottom plate. The inclinations of the heat discharge blades in respect to the upper surface of the bottom plate are configured such that neighbouring heat discharge blades alternately approach one another and move away from each other, wherein the neighbouring heat discharge blades approaching one another are connected to one another at the end regions thereof facing away from the upper surface of the bottom plate directly or by means of a cover wall and delimit a first air flow channel, and wherein the neighbouring heat discharge blades moving away from one another delimit a second air flow channel, which is open at the side thereof facing away from the upper surface of the bottom plate, wherein the heat discharge blades have a plurality of air holes and/or air vents.

Concomitant with a permanently increasing performance of electronic components and hardware in electronic devices, there is existent the demand to carry out, by way of more compact design and higher integrity density, at least the same functions in smaller volumes. As the service life and the functionality of electronic components is directly dependent on a sufficient heat discharge, it is necessary to increase the capacity of cooling in parallel to an increase of the performance. The task of the additional cooling has to be assumed by either the housing of the electronic system or by a cooling body.

The possible heat discharge and the surface available for cooling are dependent on one another. Cooling bodies are consequently regularly configured such that they increase the heat discharge thereof by increasing the effective surface of the electronic component. Furthermore, there are high demands in regard to the heat conductivity of the material used, the mass thereof as well as the total weight resulting therefrom of this unit.

A cooling body of the type mentioned is disclosed in the patent publication U.S. Pat. No. 5,701,951A. FIG. 3 of this patent publication shows a cooling body comprising a holding device or a U-shaped holding plate 30, a ventilator unit 40 mounted on the holding plate 30, a heat conducting horizontal base plate 50 configured to contact the upper surface of a central processing unit 20 as well as a corrugated porous heat discharge plate 60 composed of several V-shaped portions 61 and produced from a flexible heat conducting material and attached to the base plate 50. The heat discharge plate 60 herein has a plurality of air holes 62, which are defined above the base plate 50 and underneath the heat discharge plate. There may be generated an air flow within the venting spaces 63 via the holes 62 by means of the ventilator unit. The holding device or the U-shaped holding plate 30, respectively, are composed of a horizontal cover wall 31 and two vertical side walls 32. Each of the side walls 32 has an inner surface, which is configured in the lower end portion 33 having an open horizontal slit 34. The open horizontal slits 34 of the holding device or the U-shaped holding plate 30, respectively, each engage two opposite side portions 51 of the base plate 50 in order to hold the ventilator unit 40 on the base plate 50 above the corrugated heat discharge plate 60.

The configuration of the holding device, in particular the arrangement of the side walls at the distal ends of the venting spaces, of the present state of the art prevents the heated air present in the venting spaces and heated by the electronic components from escaping the distal ends of the venting spaces. In the case of a U-shaped configuration of the holding device, in addition, there will be prevented escape of the heated air transversely to the venting spaces at least on a further side of the heat discharge plate. The disadvantages mentioned above result in the fact that the heated air may hardly or only slowly, respectively, from the heat discharge plate and, hence, the heat discharging electronic components cannot be sufficiently cooled anymore and the electronic components may continue to heat, respectively. This effect will be increased by the air flow generated by the ventilator unit and blown onto the heat discharge plate. This air flow causes, in particular in the centre of the heat discharge plate, a pressure drop, thus causing a significantly lower air outflow rate of the air heated. There may be developed so called "hot spots" in the centre of the heat discharge plate.

A further disadvantage of the cooling body disclosed in the U.S. Pat. No. 5,701,951A is that, due to the configuration of the heat discharge plate in co-operation with the arrangement of the side walls of the holding device at the distal ends of the venting spaces, the heated air to escape from the heat discharge plate may return to the venting spaces and the heated air may thus pass the venting spaces several times. This will negatively affect the cooling effect of the cooling body of the state of the art in question.

There is thus a demand to provide a device, which prevents the disadvantages mentioned above, and which may achieve maximum heat transfer at a minimum of material, volume and surface.

The present invention solves the tasks posed by providing a heat discharge device having the features of claim 1. Advantageous embodiments of the invention result from the subclaims, the specification and the drawings.

In the heat discharge device according to the invention, the first air flow channels are configured to be open at the opposite distal ends thereof and the second air flow channels are configured to be closed at the opposite distal ends thereof. It is advantageous that in this way there is developed a forced air flow enabling to create a possibly even pressure distribution within the heat discharge blades, whereby the air heated by the electronic components may be efficiently discharged. In this way, an improved cooling of these components will be achieved. The air inflow and the air outflow are preferably carried out via different axes. For example, the air inflow may be realized via a vertical axis, and the air outflow may be realized via a horizontal axis extending transversely to the vertical axis or vice versa if the ventilator is operated in suction mode. The largest heat transfer is realized predominantly within the plurality of air holes and/or air vents of the heat discharge clades, wherein the air flow will pass the air holes and/or air vents preferably only once.

In a preferred embodiment, the first air flow channels have an essentially trapezoid cross-sectional shape. In this way, there may be achieved a narrow blade distance and, nevertheless, a sufficient flow area within the second air flow channels may be ensured. By way of parallel switching of a plurality of first air flow channels, there may be achieved a low construction height, which will cause only small temperature losses between bottom plate and blade tip.

In a preferred embodiment, the distal ends of the second air flow channels are configured to be closed by crimping the ends. In this way, there may be provided in a cost-saving and time-saving way the forced air flow mentioned above within the air holes/and/or the air vents. The second air flow channels mentioned have preferably an essentially V-shaped cross-sectional shape.

In a preferred embodiment, the sum of the cross-sectional areas of all first air flow channels is smaller than the sum of the areas of the air holes or air vents, respectively, within the heat discharge blades delimiting the first air flow channels. In this regard it is especially advantageous that in the case of an air inflow supplied vertically to the cover wall, there is allowed a high air outflow rate of the warm air to be discharged. In this way, the construction volume of the first air flow channels is reduced.

In a preferred embodiment, the upper surface of the bottom plate has rib, on which the heat discharge blades are disposed. The ribs mentioned are of an essentially equal width as the ends of the neighbouring heat discharge blades moving away from one another and facing the upper surface of the bottom plate. The contact surface developed therefrom may promote heat transfer from the bottom plate to the heat discharge blades. The ribs mentioned may be produced by chipping production methods such as by means of milling.

In an alternative embodiment, the upper surface of the bottom plate has slits, into which are the heat discharge blades are inserted. In the course of the production of the heat discharge device, in this way the heat discharge blades may be pre-disposed in a first step on the upper surface of the bottom plate, before the heat discharge blades then are rigidly connected in a further step to the bottom plate, for example, by way of bonding, soldering, grouting, friction welding, laser welding or other methods known in prior art. In addition, the slits may provide to the heat discharge blades, in dependence of the depth thereof, additional stability in regard to mechanical stress, which is particularly advantageous if the present heat discharge device is exposed to vibrations, for example. As in the preferred embodiment mentioned before, the slits are of an essentially equal width as the ends of the neighbouring heat discharge blades moving away from one another and facing the upper surface of the bottom plate. Due to the contact surface developing in this embodiment, heat transfer from the bottom plate to the heat discharge blades may be promoted. The slits mentioned may be produced by means of chipping production methods such as, for example, milling. The bottom plate may be produced by way of die casting or cold extrusion.

In a preferred embodiment, the heat discharge blades are connected to the ribs or slits by means of a material bond, in particular a heat conducting adhesive bond. In this way, there may be produced a simple and cheap connection of bottom plate and heat discharge blades, which may enable an optimal heat transfer from the bottom plate to the heat discharge blades.

In a preferred embodiment, the heat discharge blades are composed of copper or aluminium. Copper and aluminium have a very good heat conductivity, which may be used to efficiently transfer the heat discharged by the electronic components from the bottom plate to the heat discharge blades. Furthermore it is advantageous that aluminium is a metal that is very easy to be mechanically processed, whereby the heat discharge blades may be produced without much technical efforts and, consequently, in a cost-effective way.

In a preferred embodiment, the bottom plate is composed of a metal, in particular of aluminium, copper, a copper-aluminium-composite or an alloy, wherein the surfaces of the bottom plate have at least in those portions, which are provided for abutment to the at least one electronic component, an electrically insulating layer, in particular an anodized layer. Due to the good heat conductivity of aluminium, the thermal energy discharged by the electronic components may be transferred via the contact surface previously mentioned to the heat discharge blades nearly without any loss. The anodized layer in comparison to other electric insulators such as, for example, synthetic resin, has the advantage that the oxidized protective layer generated during the anodization method will have a more favourable heat conductivity.

In a preferred embodiment the bottom of the bottom plate is configured to be arranged on the at least one electronic component, by being provided with relief-shaped recesses, the shape and dimension of which corresponding essentially to the contour of the electronic component. In this way, it is possible to form a contact between the electronic components and the bottom plate in such a way that there is formed only a narrow gap between the surface of the electronic components and the relief-like recesses of the bottom of the bottom plate. This narrow gap is filled, free from air, with a material that is a good heat conductor such as heat conductive paste, gel, phase-changing material, foam or grouting mass. In addition, through the relief-like recesses, there may be formed a contact between the bottom of the bottom plate and one of the printed circuit boards comprising electronic components essentially also free from air gaps, as described above in a good heat conducting manner. In addition to the heat generated by the components, the heat discharged by the printed circuit board may be transferred to the bottom plate. The recesses may be produced by way of methods known from prior art such as, for example, milling or embossing.

In a preferred embodiment, the air holes of the heat discharge blades are configured as round holes and/or elongate holes. In this way, an air flow generated, for example, by a ventilator may flow essentially unhindered from the first air flow channel into the second air flow channel or vice versa. In addition, there may be formed by the plurality of the air holes and, in the case of round holes, by the circular configuration of these air holes an area as large as possible within a small space, which makes it possible to create different flow rates within the first and second air flow channels mentioned before, whereby heat may be discharged more quickly. It is to be mentioned that the air holes may have, apart from round and elongate holes, any further geometric shape, such as polygon shapes or, for example, an elliptical form.

In a preferred embodiments, the air vents of the heat discharge blades are configured to be in parallel to one another and orthogonal to the upper surface of the bottom plate upright within the heat discharge blades. In this way, the area previously mentioned and formed by the air holes may be increasingly enlarged, whereby there may be created an even more efficient air flow between the first air flow channel and the second air flow channel. The air vents may be produced by way of chipping production methods, preferably by sawing.

In a preferred embodiment, the heat discharge blades are configured as extruded sections. It is of advantage that the heat discharge blades in this way may be produced having a high forming degree and may be cost-efficiently produced. The extruded sections may be produced by way of various extrusion methods such as, e.g., direct, indirect or hydrostatic extrusion methods. Furthermore, the heat discharge blades and the bottom plate may also be produced to be integral by way of extrusion. It is of advantage that the heat developed by the components may be discharged nearly without any loss and without use of a heat conducting adhesive via the heat discharge blades. The heat discharge blades, however, may also be produced using other methods and are consequently not limited to the production by means of extrusion. In this way, the heat discharge blades may be produced, for example, by means of 3D print, wherein there may be used, for example, metal filaments as material, which comprise a mixture of metal powders (e.g. aluminium or copper) and plastic materials (e.g. PLA or ABS). The heat discharge blades may also be produced from a metal sheet, which is arcuate and bonded to the bottom plate. The air holes and/or air vents may be produced, for example, by means of etching, punching or cutting. Latter may, for example, be laser cutting or water jet cutting. The heat discharge blades are preferably configured as trapezoid coil springs.

In a preferred embodiment, the heat discharge device has at least one electric ventilator arranged above the heat discharge blades, wherein the ventilator in operation blows an air flow into the open second air flow channels and wherein the at last one ventilator is mounted at the front faces of the bottom plate or at side walls extending upwards at or near the front faces of the bottom plate. It is of advantage that in this way the air flow necessary for cooling the electronic components may be adjusted to the amount of heat to be discharged. In this way, the at least one ventilator may be operated at a high heat discharge of the electronic components at maximum performance, i.e. the highest revolution speed possible, and vice versa, whereby the electronic components may be sufficiently cooled in nearly any operational mode. With electronic components having especially high heat discharge and/or when cooling a plurality of electronic components, there is provided to arrange a second electric ventilator above the heat discharge blades, in parallel to the first ventilator at the front faces of the bottom plate or at the side walls of the bottom plate. This second ventilator has essentially the same technical features as the first electric ventilator previously described. The ventilators may be bonded to the front face of the bottom plate or to the side walls mentioned above and/or they may be attached by means of attachment elements such as, for example, screws. In an alternative embodiment there is provided that the air flow mentioned may be generated without using a ventilator. For example, the headwind generated by a moving vehicle may be used as air flow for cooling the components mentioned above. This is in particular advantageous for double-wheeled vehicles such as, e.g., motorcycles, as, depending on the installation of the heat discharge device, the headwind may flow through the heat discharge device essentially completely. It is advantageous that in this way the ventilator noise generated by the ventilators in operation may be prevented. There are, however, necessary certain prerequisites, which have to be followed, in order to obtain sufficient cooling of the electronic components. For example, shutdowns should be mostly prevented and pre-set minimum velocities should be kept in order to prevent over-heating of the components. In a further alternative embodiment, the ventilators may be configured in such a way that they suck in air instead of blowing air onto the heat discharge blades. Alternating between air inflow and air outflow direction may be of advantage in certain fields of use, if it is absolutely necessary, for example, to create an as even pressure distribution as possible within the heat discharge blades. In addition, this will allow for dust removal of the cooling blades or discharging foreign matter having been sucked in.

In a preferred embodiment, the at least one ventilator is mounted by means of a mounting element connected to all heat discharge blades 30 at the distal ends 34' of the second air flow channels 34 to the front faces of the bottom plate or to side walls extending upwards at or near the front faces of the bottom plate. The mounting element may be bonded to the front face of the bottom plate or the side walls and/or it may be attached by means of attachment means such as screws. The material of the mounting element is preferably plastic material, wherein the mounting element may also be of any other material such as, e.g. metal. It is of advantage that the mounting element will provided additional stability to the electric ventilators and thereby the ventilator may be better protected against mechanical stress.

The invention is now explained in greater detail in reference to the drawings by way of non-limiting embodiment examples.

Figure 3:
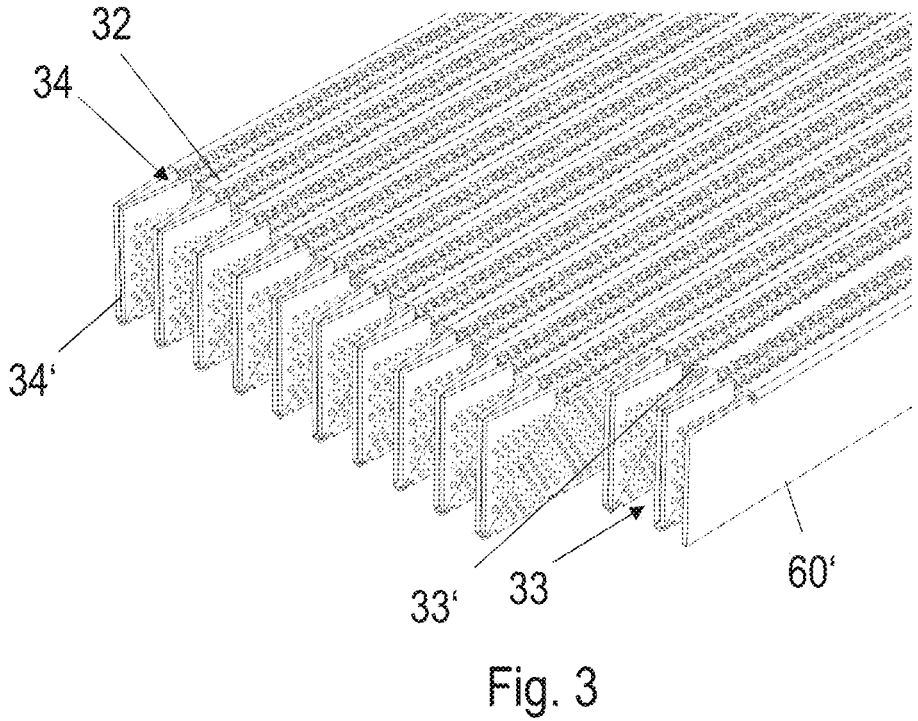
FIG. 3 shows heat discharge blades according to the present invention having open or closed, respectively, air flow channels at opposite distal ends.

In the following there is made reference to the drawings and initially to the FIGS. 1 and 3. Hence, the present invention comprises a heat discharge device 100 for the arrangement on at least one electronic component 11. The heat discharge device 100 comprises further a heat conductive bottom plate 20 having a bottom 21 and an upper surface 22 facing away from the bottom 21, wherein heat discharge blades 30 extend between two opposing front faces of the bottom plate 20 from the upper surface 22 of the bottom plate 20 transversely across the bottom plate 20 and inclined in respect to the upper surface of the bottom plate 20. The bottom plate thus is composed of metal, in particular aluminium, or an alloy, wherein the surfaces of the bottom plate have at least in those portions, which are provided for abutment to the at least one electronic component, an electrically insulating layer, in particular an anodized layer. The inclinations of the heat discharge blades 30 in respect of the upper surface 22 of the bottom plate 20 are configured such that neighbouring heat discharge blades 30 alternatingly approach one another or move away from one another. The neighbouring heat discharge blades approaching one another are connected to one another at their end regions facing away from the upper surface 22 of the bottom plate 20 directly or by means of a cover wall 32 and delimit a first air flow channel 33. The neighbouring heat discharge blades 30 moving away from one another delimit a second air flow channel 34, which is open at the side thereof facing away from the upper surface 22 of the bottom plate 20. The first air flow channels 33 hereby have an essentially trapezoid cross-sectional shape. The heat discharge blades 30 have a plurality of air holes 31 and/or air vents 31', wherein the sum of the cross-sectional areas of all first air flow channels is smaller than the sum of the areas of the air holes 31 or the air vents 31', respectively, within the heat discharge blades 30 delimiting the first air flow channels 33. The first air flow channels 33 are hereby configured to be open at their opposite distal ends 33' thereof and the second air flow channels 34 at their opposite distal ends 34' closed by crimping the ends. In order to configure the ends 34' mentioned to be closed, there may be used any methods known form prior art, thus not being limited to the crimping of these ends 34'. The heat discharge blades 30 mentioned above are configured as extruded section, wherein these may be produced by way of various extrusion methods such as, for example, by means of direct, indirect or hydrostatic extrusion methods. Furthermore, the heat discharge blades 30 and the bottom plate 20 may also be produced as an integral piece by extrusion. A further production method for producing the heat discharge blades 30 could be 3D printing, wherein there may be used as a material, for example, metal filaments comprising a mixture of metal powders (e.g., aluminium or copper) and plastic materials (e.g., PLA or ABS). In another further production method, the heat discharge blades 30 could also be produced from a metal sheet, which is arcuate and bonded to the bottom plate 20. The air holes 31 and/or air vents 31' hereby could be produced by way of etching, punching or cutting, for example. Latter could be, for example, laser cutting or water jet cutting. According to an alternative embodiment variant of the heat discharge device 100 according to the invention, the heat discharge blades 30 are configured as trapezoid coil springs.

Figure 1:
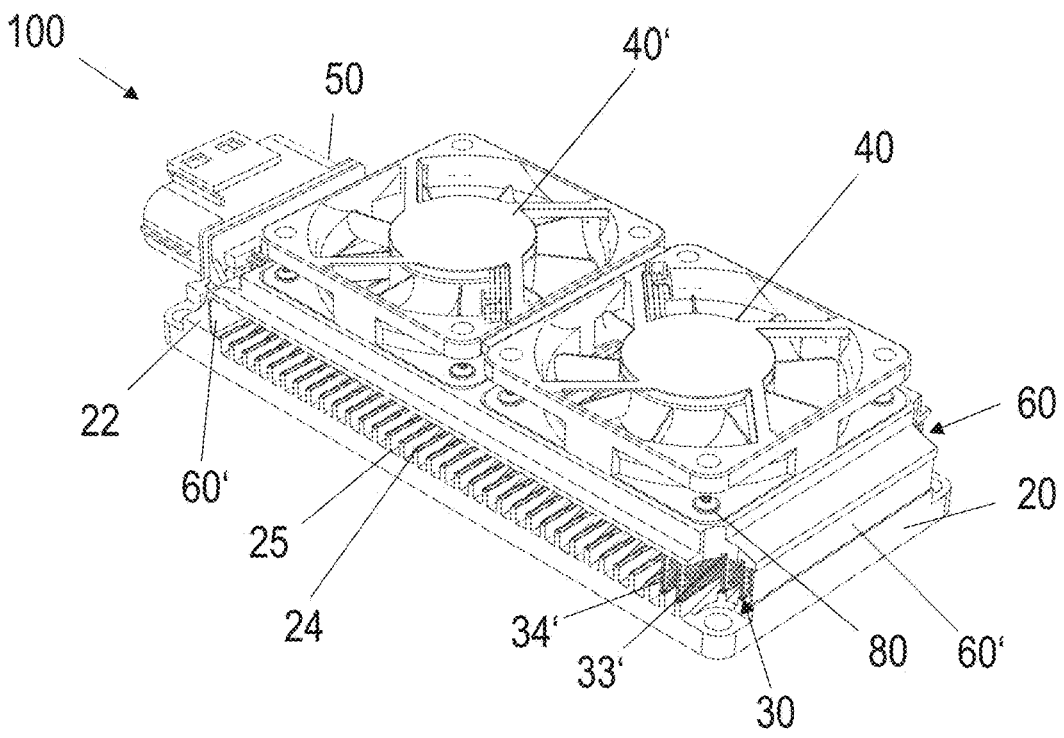
FIG. 1 shows a perspective of a heat discharge device according to the present invention in a preferred embodiment.
Figure 2:
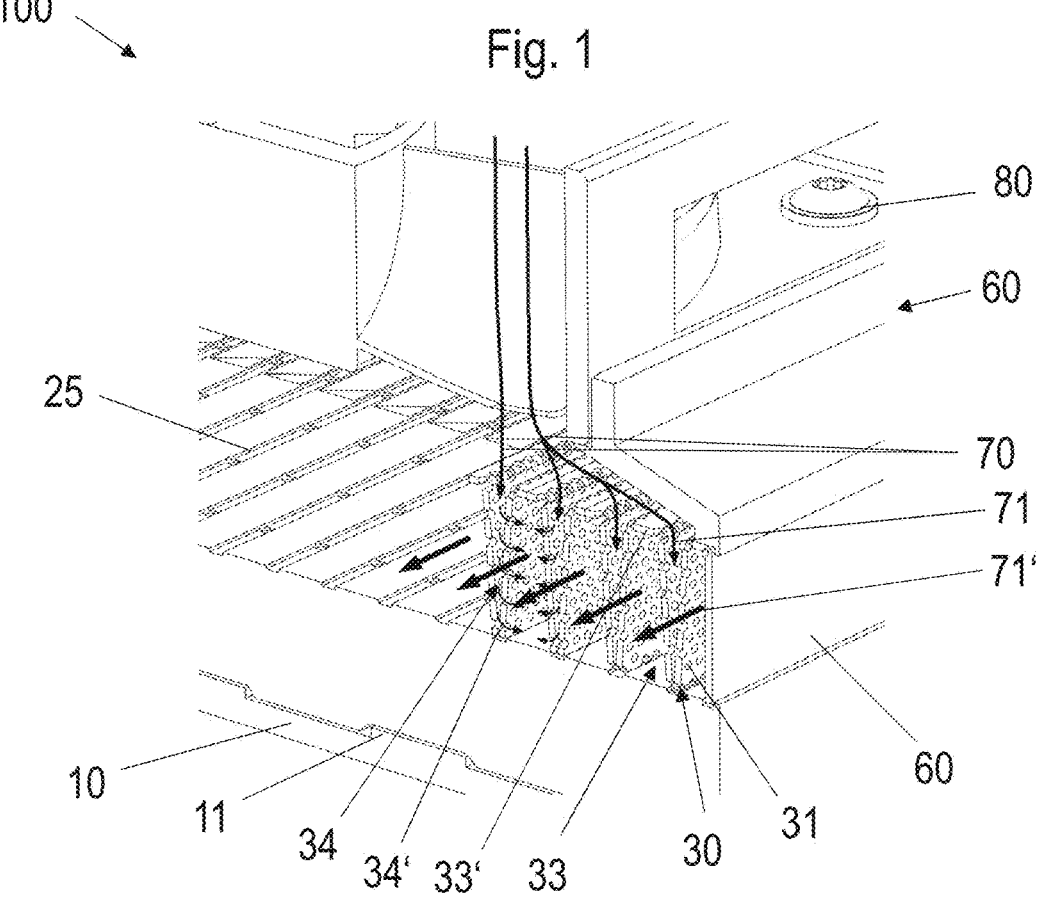
FIG. 2 shows a perspective front view of the heat discharge device with an air flow course.

As visible in FIG. 1, the upper surface 22 of the bottom plate 20 has ribs 24, on which the heat discharge blades 30 made from copper or aluminium are disposed. Alternatively, as depicted in FIG. 2, the upper surface 22 of the bottom plate 20 may have slits 25, into which the heat discharge blades 30 are inserted. In both embodiments, the heat discharge blades 30 are connected to the ribs 24 or slits 25 by means of a material bond, in particular a heat conducting adhesive bond.

Figure 4:
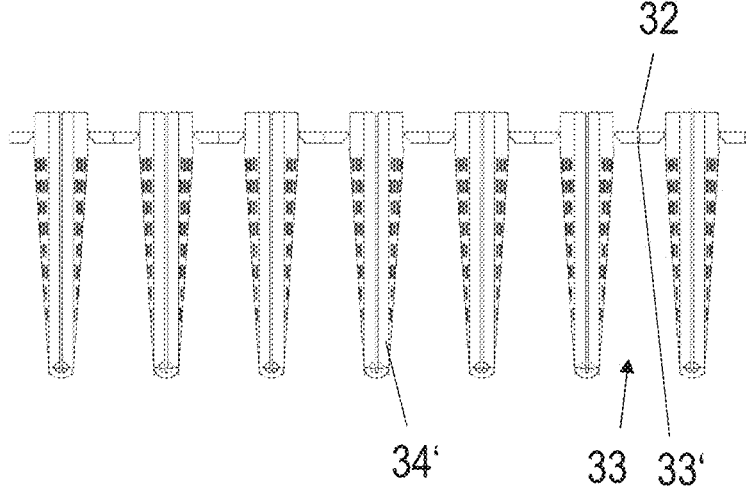
FIG. 4 shows a front view of the heat discharge blades.

FIG. 1 further shows the second air flow channels 34 having closed, i.e. crimped, distal ends 34' opposite to one another, wherein FIG. 2 illustrates a sectional view through the heat discharge device or a sectional view through the second air flow channels 34, respectively. FIGS. 3 and 4 show the heat discharge blades 30 with the first air flow channels 33 and the second air flow channels 34 in detail. In this regard, according to the present invention, the opposite distal ends 33' of the first air flow channels 33 are open and the opposite distal ends 34' of the second air flow channels 34 are closed, in particular crimped. The air holes 31 of the heat discharge blades 30 are thereby configured as round holes and/or elongate holes. Apart from round holes and elongate holes, the heat discharge blades may have any other geometrical shape.

Figure 5:
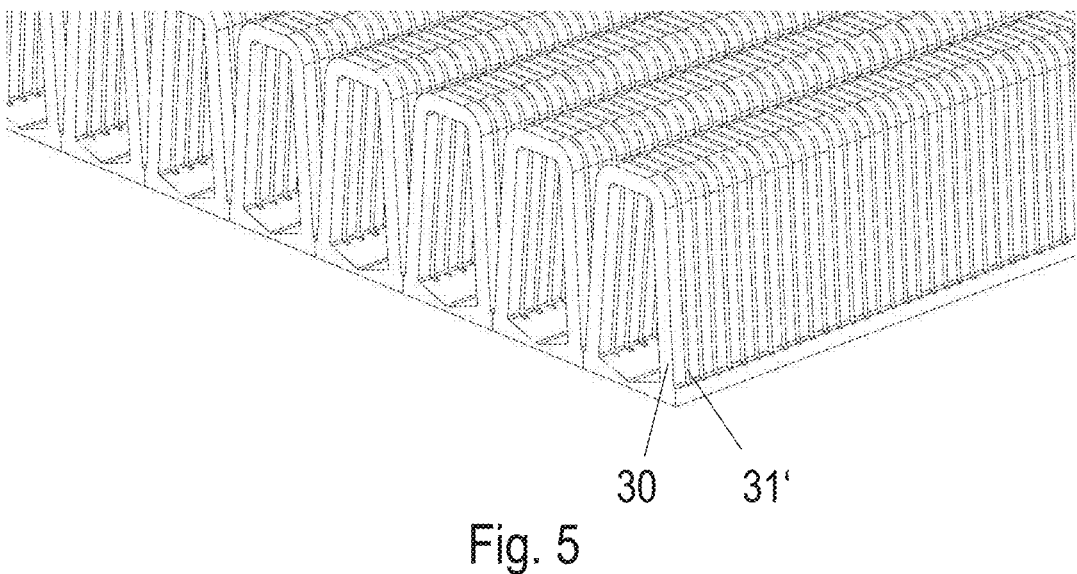
FIG. 5 shows a perspective front view of heat discharge blades having air vents.

In FIG. 5, the heat discharge blades 30 are depicted having air vents 31', which may be configured in parallel to one another and orthogonal to the upper surface 22 of the bottom plate 20 upright within the heat discharge blades 30 and may be produced by way of chipping production methods, preferably by sawing. The heat discharge blades 30 may also have a combination of air holes 31 and air vents 31'.

Figure 6:
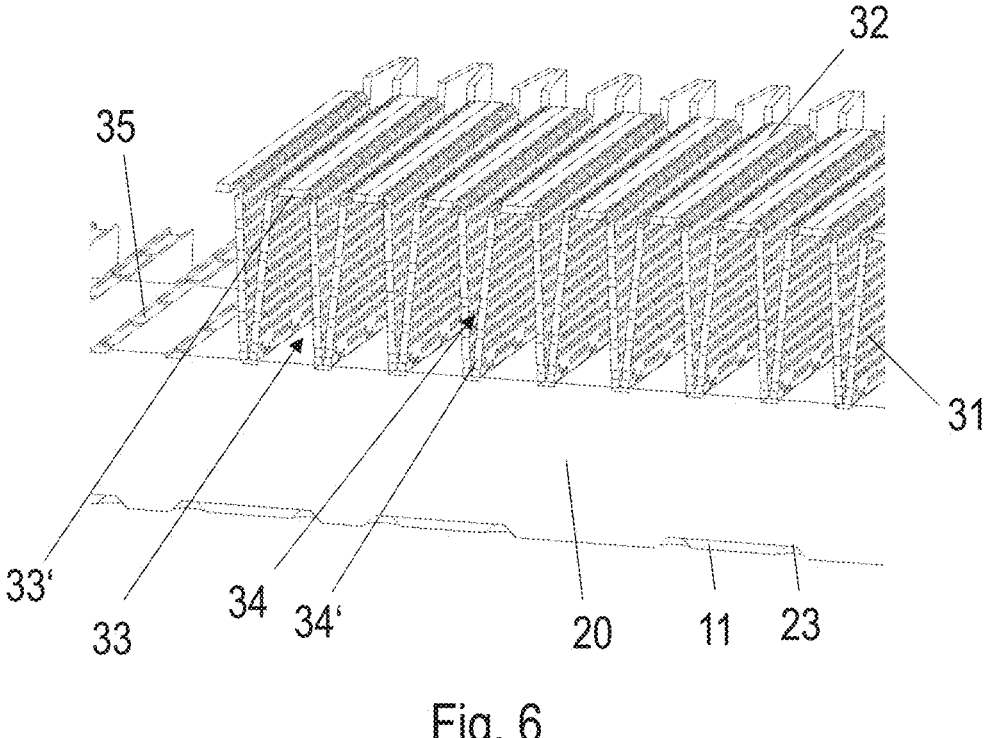
FIG. 6 shows a perspective front view of the heat discharge blades arranged in slits of a bottom plate.

FIG. 6 shows a sectional view through the heat discharge device 100 and the arrangement of the heat discharge blades 30 in slits 25 of the upper surface 22 of the bottom plate 20. As described above, the heat discharge blades 30 are connected to the bottom plate 20 by means of a material bond, in particular a heat conductive adhesive bond. For reasons of clarity, the second air flow channels 34 depicted in FIG. 6 are open at one distal end 34' and closed by means of crimping at the end opposite to the distal end 34'.

Figure 7:
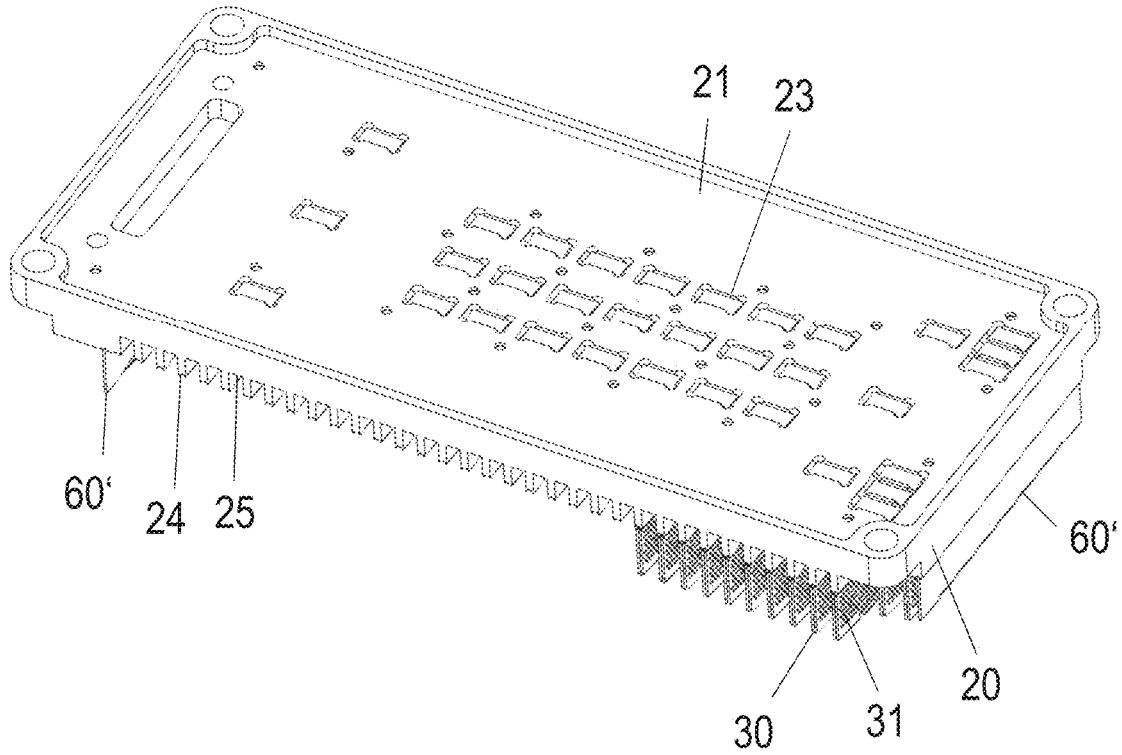
FIG. 7 shows a bottom perspective of the heat discharge device.

FIG. 7 shows the bottom 21 of the bottom plate 20, which is arranged on the at least one electronic component 11, by being provided with relief-like recesses 23, the shape and dimension of which essentially corresponding to the contour of the electronic component 11 or the contour of the printed circuit board or the electronic assembly, respectively. The electronic component 11 is herein disposed on a printed circuit board 10. The bottom plate 20 forms a contact with the electronic component 11 in such a way that there is formed between the surface of the electronic component 11 and the relief-like recesses 23 of the bottom 21 of the bottom plate 20 essentially only a narrow gap. This narrow gap is then filled with a material, which is a good heat conductor, such as a heat conductive paste, gel, phase change material, foam or grouting mass, free from air. The relief-like recesses 23 further enable to form a contact, essentially free from an air gap, as described above, between the circuit board 10 through the bottom 21 of the bottom plate 20. The recesses may be produced by methods known from prior art such as milling or embossing.

In the following there is again made reference to FIGS. 1 and 2. As visible in FIG. 1, the heat discharge device 100 has at least one electronic ventilator 40 arranged above the heat discharge blades 30. This ventilator in operation blows an air flow, as visible in FIG. 2, into the open second 32 air flow channels. The air inflow 71 and the air outflow 71' are realized preferably via different axes. For example, the air inflow 71 may be carried out via a vertical axis, and the air outflow 71' may be realized via a horizontal axis extending transversely to the vertical axis or vice versa if the ventilator 40 is operated in suction operation instead of a blowing operation. The highest heat transfer thereby is realized preferably within the plurality of air holes 31 and/or air vents 31' of the heat discharge blades 30, wherein the air flow 70 passes the air holes 31 and/or the air vents 31' preferably only once.

The at least one ventilator 40 is mounted at the front faces of the bottom plate 20 or at the side walls 60' extending upwards at the or near the front faces of the bottom plate 20. Alternatively, the at least one ventilator is mounted by means of a mounting element 60 connected to all heat discharge blades 30 at the distal ends 34' of the second air flow channels 34 to the front faces of the bottom plate 20 or the side walls 60' extending upwards at the or near the front faces of the bottom plate 20. The material of the mounting element 60 is preferably plastic material, wherein the mounting element 60 may also be composed of any other material such as, for example, metal. The at least one ventilator 40 is connected to the mounting element 60 by means of attachment elements such as, e.g., screws 80, wherein the ventilator 40 may also be bonded to the mounting element 60.

In electronic components with particularly high heat discharge and/or when cooling a plurality of electronic components, there is provided to arrange a second 40' electric ventilator above the heat discharge blades 30, in parallel to the first 40 ventilator. This second ventilator has essentially the same technical features as the electric ventilator 40 previously described. In an alternative embodiment there is made provision that the air flow 70 necessary for cooling the electronic components 11 may be generated without using a ventilator 40, 41. There may, for example, be used the headwind generated by a moving vehicle, e.g. a motorcycle, as air flow 70 for cooling the electronic components 11 mentioned above.

The invention claimed is:

1. A heat discharge device configured for arrangement on an electronic component, comprising a heat conductive bottom plate having a bottom and an upper surface facing away from the bottom,
   wherein each heat discharge blade of a group of heat discharge blades extends continuously between two opposite front faces of the bottom plate from the upper surface of the bottom plate transversely across the bottom plate and inclined in respect to the upper surface of the bottom plate,
   wherein each of the heat discharge blades delimits a first air flow channel within an interior of the heat discharge blade,
   wherein neighbouring heat discharge blades cooperate with each other to delimit a second air flow channel between the neighbouring heat discharge blades that is open at a side thereof facing away from the upper surface of the bottom plate,
   wherein the heat discharge blades each define a plurality of air holes extending through a portion of the heat discharge blade, and
   wherein the first air flow channel is configured to be open at opposite distal ends thereof and the second air flow channel is configured to be closed at opposite distal ends thereof.

2. The heat discharge device according to claim 1, wherein the first air flow channel has a trapezoid cross-sectional shape.

3. The heat discharge device according to claim 1, wherein the distal end of the second air flow channel is configured to be closed by crimping the ends.

4. The heat discharge device according to claim 1, wherein a cross-section area of the first air flow channel is smaller than a sum of areas defined by the air holes in the heat discharge blades delimiting the first air flow channel.

5. The heat discharge device according to claim 1, wherein the upper surface of the bottom plate has ribs, on which there are arranged the heat discharge blades.

6. The heat discharge device according to claim 1, wherein the upper surface of the bottom plate has slits, into which the heat discharge blades are inserted.

7. The heat discharge device according to claim 5, wherein the heat discharge blades are connected to the ribs or slits by a heat conductive adhesive bond.

8. The heat discharge device according to claim 1, wherein the heat discharge blades are composed of copper or aluminium.

9. The heat discharge device according to claim 1, wherein the bottom plate is composed of copper, a copper-aluminium-composite, or an alloy.

10. The heat discharge device according to claim 9, wherein surfaces of the bottom plate have at least in those portions, which are provided for abutment to an electronic component, an electrically insulating layer, in particular an anodized layer.

11. The heat discharge device according to claim 1, wherein the bottom of the bottom plate is configured to be arranged at the at least one electronic component by being provided with recesses each comprising a relief configuration, the shape and dimension of which correspond to a contour of the electronic component.

12. The heat discharge device according to claim 1, wherein the air holes of the heat discharge blades are configured as round holes and/or elongate holes.

13. The heat discharge device according to claim 1, wherein the heat discharge blades include air vents that are configured in parallel to one another and orthogonal to the upper surface of the bottom plate upright within the heat discharge blades.

14. The heat discharge device according to claim 1, wherein the heat discharge blades are configured as extruded sections.

15. The heat discharge device according to claim 1, wherein the heat discharge device has at least one electric ventilator arranged above the heat discharge blades.

16. The heat discharge device according to claim 15, wherein the ventilator, in operation, blows an air flow into the second air flow channel.

17. The heat discharge device according to claim 15, wherein the at least one ventilator is mounted at the front faces of the bottom plate or at side walls extending upwards at or near the front faces of the bottom plate.

18. The heat discharge device according to claim 17, wherein the at least one ventilator is mounted at the front faces of the bottom plate or at side walls extending upwards at or near the front faces of the bottom plate by a mounting element connected to all heat discharge blades at the distal ends of the second air flow channels.

19. The heat discharge device according to claim 1, wherein the heat discharge blades are configured as trapezoid coil springs.

* * * * *